United States Patent
Gejo (10) Patent No.: US 10,636,898 B2
(45) Date of Patent: Apr. 28, 2020

(54) SEMICONDUCTOR DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventor: Ryohei Gejo, Kanazawa (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 0 days.

(21) Appl. No.: 16/204,189

(22) Filed: Nov. 29, 2018

(65) Prior Publication Data
US 2020/0058779 A1  Feb. 20, 2020

(30) Foreign Application Priority Data

Aug. 15, 2018 (JP) ................... 2018-152946
Nov. 16, 2018 (JP) ................... 2018-215265

(51) Int. Cl.
*H01L 29/66* (2006.01)
*H01L 29/739* (2006.01)
(Continued)

(52) U.S. Cl.
CPC ...... *H01L 29/7397* (2013.01); *H01L 29/0804* (2013.01); *H01L 29/0821* (2013.01);
(Continued)

(58) Field of Classification Search
CPC .............. H01L 29/7397; H01L 29/082; H01L 29/41708; H01L 29/1095; H01L 29/0804; H01L 29/4236; H01L 27/0716
(Continued)

(56) References Cited

U.S. PATENT DOCUMENTS 8,564,097 B2 * 10/2013 Udrea ................. H01L 29/0834
                                                257/570
9,601,485 B2 *  3/2017 Takahashi ........... H01L 29/7397
(Continued)

FOREIGN PATENT DOCUMENTS

JP    2011-114027    6/2011
JP    2015-103697    6/2015
JP    2015-211149   11/2015

OTHER PUBLICATIONS

Jiang, H., et al. "A Snapback Suppressed Reverse-Conducting IGBT With a Floating p-Region in Trench Collector", IEEE Electron Device Letters, vol. 33, No. 3, p. 417-419.

*Primary Examiner* — Vu A Vu
(74) *Attorney, Agent, or Firm* — Oblon, McClelland, Maier & Neustadt, L.L.P.

(57) ABSTRACT

A semiconductor device includes a first semiconductor layer, a second semiconductor layer selectively provided on the first semiconductor layer, a third semiconductor layer selectively provided on the second semiconductor layer, and a control electrode facing a portion of the second semiconductor layer via a first insulating film. The device further includes a fourth semiconductor layer provided on a lower surface side of the first semiconductor layer, a fifth semiconductor layer arranged with the fourth semiconductor layer along a lower surface of the first semiconductor layer, and a sixth semiconductor layer provided between the first and fifth semiconductor layers. The sixth semiconductor layer is connected to the fourth semiconductor layer. The device includes a connecting portion positioned between the first and fifth semiconductor layers. The connecting portion electrically connects the fifth semiconductor layer to the first semiconductor layer, and the sixth semiconductor layer is not provided at the connecting portion.

15 Claims, 7 Drawing Sheets

(51) Int. Cl.
  *H01L 29/10* (2006.01)
  *H01L 29/08* (2006.01)
  *H01L 29/417* (2006.01)
  *H01L 29/423* (2006.01)
  *H01L 27/07* (2006.01)

(52) U.S. Cl.
  CPC .... *H01L 29/1095* (2013.01); *H01L 29/41708* (2013.01); *H01L 29/4236* (2013.01); *H01L 27/0716* (2013.01)

(58) Field of Classification Search
  USPC .......................................................... 357/140
  See application file for complete search history.

(56) References Cited

U.S. PATENT DOCUMENTS

| | | |
|---|---|---|
| 2015/0144995 A1 | 5/2015 | Takahashi |
| 2017/0069625 A1 | 3/2017 | Hirabayashi et al. |

\* cited by examiner

SEMICONDUCTOR DEVICE

CROSS-REFERENCE TO RELATED APPLICATIONS

This application is based upon and claims the benefit of priority from Japanese Patent Application No. 2018-152946, filed on Aug. 15, 2018, and Japanese Patent Application No. 2018-215265, filed on Nov. 16, 2018; the entire contents of all of which are incorporated herein by reference.

FIELD

Embodiments relate generally to a semiconductor device.

BACKGROUND

A power converter controlling high breakdown voltage and large current is configured using a switching element such as an IGBT (Insulated Gate Bipolar Transistor) and a diode element. For example, it is possible to simplify the configuration of the power converter and to achieve downsizing thereof by using a semiconductor device which includes the switching element and the diode element integrated into one chip. However, such a semiconductor device is required to reduce the switching loss and electrical conduction loss.

DETAILED DESCRIPTION

According to one embodiment, a semiconductor device includes a first semiconductor layer of a first conductivity type, a second semiconductor layer of a second conductivity type selectively provided on the first semiconductor layer, a third semiconductor layer of the first conductivity type selectively provided on the second semiconductor layer, a first insulating film covering a portion of the second semiconductor layer positioned between the first semiconductor layer and the third semiconductor layer, a control electrode facing the portion of the second semiconductor layer via the first insulating film. The device further includes a fourth semiconductor layer of the second conductivity type provided on a lower surface side of the first semiconductor layer, a fifth semiconductor layer of the first conductivity type arranged with the fourth semiconductor layer in a first direction along a lower surface of the first semiconductor layer, and a sixth semiconductor layer provided between the first semiconductor layer and the fifth semiconductor layer. The sixth semiconductor layer is connected to the fourth semiconductor layer. The sixth semiconductor layer having a compensated concentration of second conductivity type impurities obtained by subtracting a concentration of first conductivity type impurities from a concentration of second conductivity type impurities. The compensated concentration of second conductivity type impurities in the sixth semiconductor layer is lower than a compensated concentration of second conductivity type impurities in the fourth semiconductor layer. The device includes a connecting portion positioned between the first semiconductor layer and the fifth semiconductor layer. The connecting portion electrically connects the fifth semiconductor layer to the first semiconductor layer, and the sixth semiconductor layer is not provided at the connecting portion.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1:
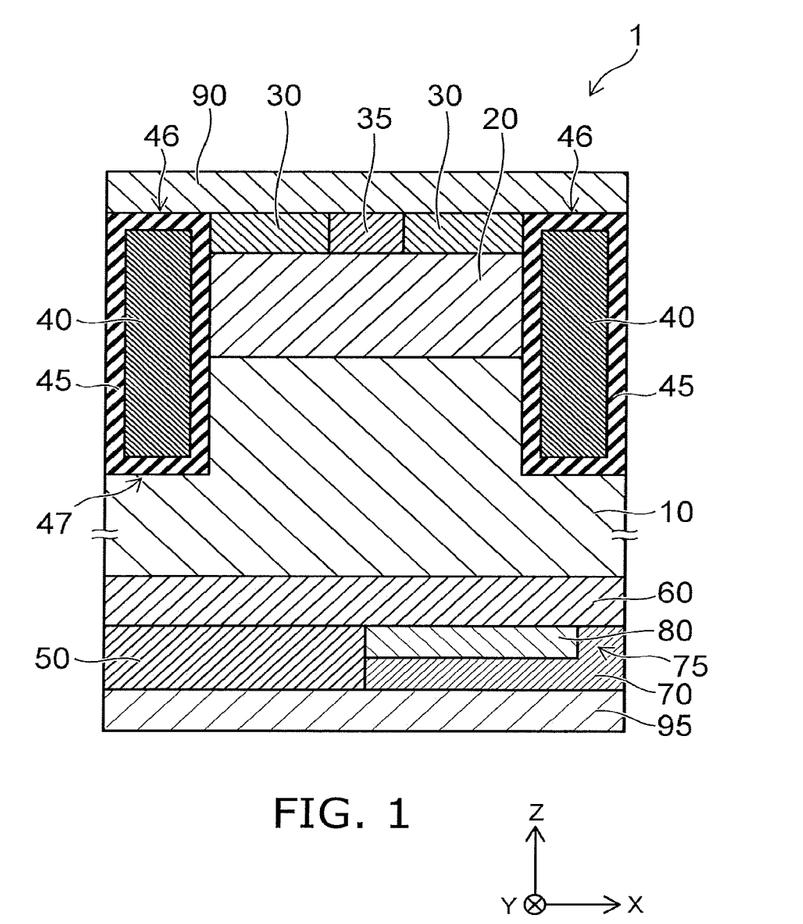
FIG. 1 is a schematic cross sectional view showing a semiconductor device according to an embodiment.

FIG. 1 is a schematic cross sectional view showing a semiconductor device 1 according to an embodiment. The semiconductor device 1 is, for example, a power semiconductor device which includes an IGBT and a diode integrated.

As shown in FIG. 1, the semiconductor device 1 includes an N-type base layer 10, a P-type base layer 20, and an N-type emitter layer 30. The P-type base layer 20 is selectively provided on the N-type base layer 10. The N-type emitter layer 30 is selectively provided on the P-type base layer 20. The N-type emitter layer 30 contains N-type impurities with a concentration higher than a concentration of N-type impurities in the N-type base layer 10.

The semiconductor device 1 further includes a gate electrode 40 and a gate insulating film 45. The gate electrode 40 is provided, for example, inside a gate trench 47 having a depth to reach the N-type base layer 10 from a level of the upper surface of the N-type emitter layer 30. The gate insulating film 45 electrically insulates the gate electrode 40 from the N-type base layer 10, the P-type base layer 20 and the N-type emitter layer 30 inside the gate trench 47. The gate electrode 40 is, for example, formed so as to face the N-type base layer 10, the P-type base layer 20 and the N-type emitter layer 30 via the gate insulating film 45.

The semiconductor device 1 further includes a P-type collector layer 50 and an N-type buffer layer 60. The P-type collector layer 50 is provided on a lower surface side of the N-type base layer 10. The P-type collector layer 50 contains P-type impurities with a concentration higher than a concentration of P-type impurities in the P-type base layer 20.

The N-type buffer layer 60 is provided between the N-type base layer 10 and the P-type collector layer 50. The N-type buffer layer 60 contains N-type impurities with a concentration higher than a concentration of N-type impurities in the N-type base layer 10.

The semiconductor device 1 further includes an N-type cathode layer 70 and a P-type barrier layer 80. The N-type cathode layer 70 is provided on a lower surface side of the N-type buffer layer 60, and is arranged with the P-type collector layer 50 in a direction along the lower surface of the N-type buffer layer 60 (for example, the X-direction). The N-type cathode layer 70, for example, contains N-type impurities with a concentration higher than a concentration of N-type impurities in the N-type buffer layer 60. The P-type barrier layer 80 is provided between the N-type buffer layer 60 and the N-type cathode layer 70. The P-type barrier layer 80 contains P-type impurities with an effective concentration lower than a concentration of P-type impurities in the P-type collector layer 50. The P-type barrier layer 80 is provided so as to be connected to the P-type collector layer 50.

Here, the "effective concentration" of P-type impurities is defined as a compensated concentration obtained by subtracting an N-type impurity concentration from an P-type impurity concentration when a semiconductor layer includes both of N-type impurities and P-type impurities and the P-type impurity concentration is higher than the N-type impurity concentration.

The semiconductor device 1 includes an N-type connection portion 75 on the lower surface side of the N-type buffer layer 60. The N-type connection portion 75 is provided at a portion where the P-type barrier layer 80 does not interpose between the N-type buffer layer 60 and the N-type cathode layer 70. The N-type cathode layer 70 is connected to the N-type buffer layer 60 via the N-type connection portion 75.

The semiconductor device 1 further includes an emitter electrode 90 and a collector electrode 95.

The emitter electrode 90 is provided on the N-type emitter layer 30 and above the gate electrode 40. The emitter electrode 90 is electrically connected to the N-type emitter layer 30 and is electrically insulated from the gate electrode 40 by an interlayer insulating film 46.

The emitter electrode 90 is electrically connected to the P-type contact layer 35. The emitter electrode 90 is electrically connected to the P-type base layer 20 via the P-type contact layer 35. The P-type contact layer 35 is provided, for example, between the N-type emitter layers 30 in the X-direction, and contacts both of the P-type base layer 20 and the emitter electrode 90. The P-type contact layer 35 contains P-type impurities with a concentration higher than a concentration of P-type impurities in the P-type base layer 20.

The collector electrode 95 is provided on a lower surface side of the P-type collector layer 50 and the N-type cathode layer 70. The collector electrode 95 contacts both of the P-type collector layer 50 and the N-type cathode layer 70. The collector electrode 95 is electrically connected to both of the P-type collector layer 50 and the N-type cathode layer 70.

The semiconductor device 1 operates as the IGBT, for example, when a negative potential is applied to the emitter electrode 90 and a positive potential is applied to the collector electrode 95. On the other hand, the semiconductor device 1 operates as a diode when a positive potential is applied to the emitter electrode 90 and a negative potential is applied to the collector electrode 95.

Figure 2A:
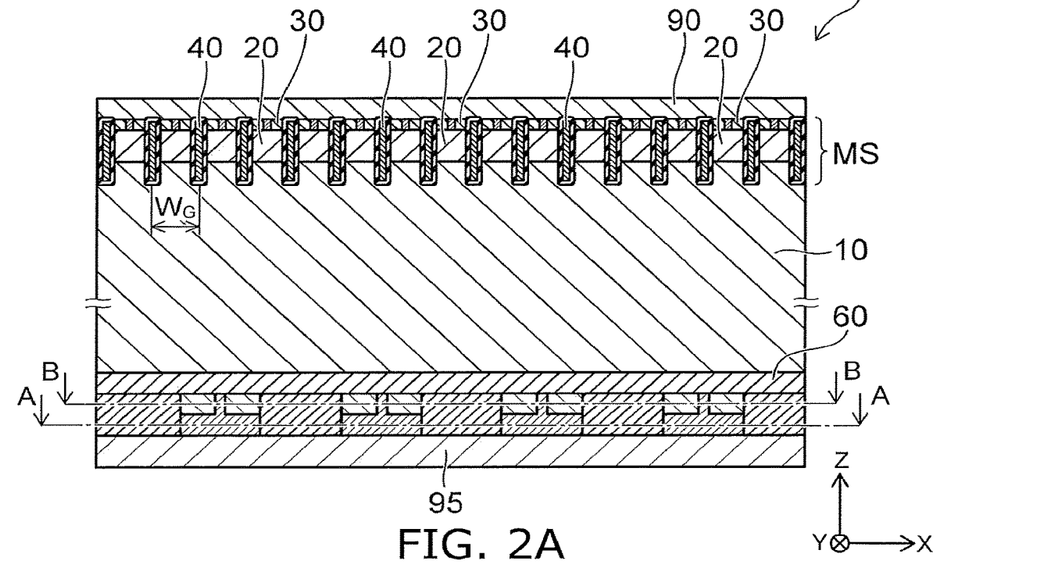
FIGS. 2A to 2C are schematic views showing the semiconductor device according to the embodiment.
Figure 2B:
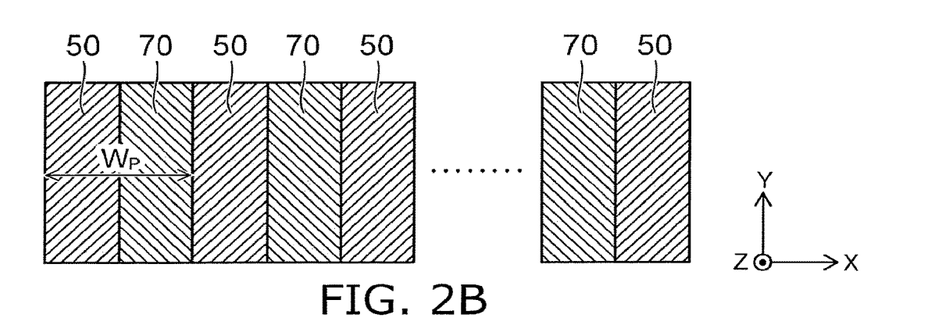
Figure 2C:
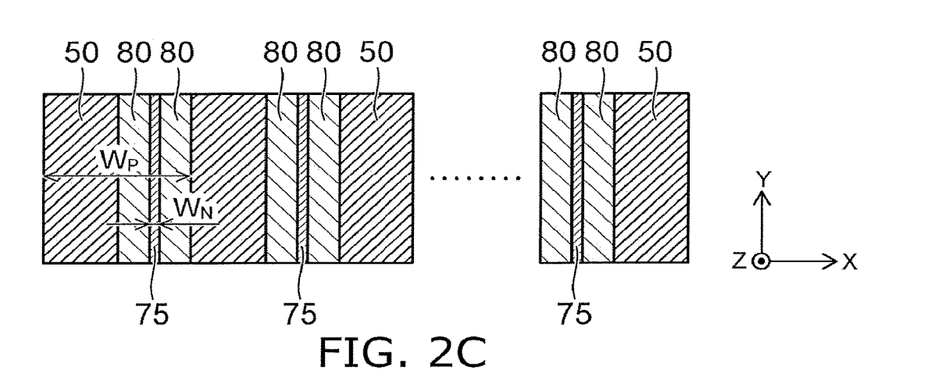

FIGS. 2A to 2C are schematic views showing the semiconductor device 1 according to the embodiment. FIG. 2A is other cross sectional view showing the semiconductor device 1. FIG. 2B is a schematic view showing cross section along A-A line shown in FIG. 2A. FIG. 2C is a schematic view showing a cross section along B-B line shown in FIG. 2A.

As shown in FIG. 2A, a MOS structure MS is provided on the N-type base layer 10. The MOS structure MS includes the P-type base layer 20, the N-type emitter layer 30, the gate electrode 40 and the gate insulating film 45.

As shown in FIG. 2B, the P-type collector layer 50 and the N-type cathode layer 70 extend, for example, in the Y-direction, and alternately disposed in the X-direction. An arrangement period $W_P$ of the P-type collector layer 50 is, for example, wider than an arrangement period $W_G$ of the gate electrode 40 (see FIG. 2A).

As shown in FIG. 2C, the P-type barrier layer 80 extends in the Y-direction, and is disposed between P-type collector layers 50. The N-type connection portion 75 is provided between P-type barrier layers 80 and, for example, extends in the Y-direction. The N-type connection portion 75 is provided at a position away from the P-type collector layer 50.

A width $W_N$ in the X-direction of the N-type connection portion 75 is, for example, 5 percent of or less than the arrangement period $W_P$ of the P-type collector layer 50, preferably being not less than 0.5 percent and not more than 1 percent. When the width $W_N$ of the N-type connection portion 75 becomes large, electrons easily flow from the N-type buffer layer 60 to the N-type cathode layer 70 via the N-type connection portion 75. Thereby, hole injection from the P-type collector layer 50 into the N-type base layer 10 is suppressed, and the IGBT operation is inhibited. As a result, the ON voltage of the semiconductor device 1 becomes large, and the electrical conduction loss increases. When the width of the N-type connection portion 75 becomes narrower, the snap back of forward current increases and the electrical conduction loss increases in the diode operation described later.

Figure 3A:
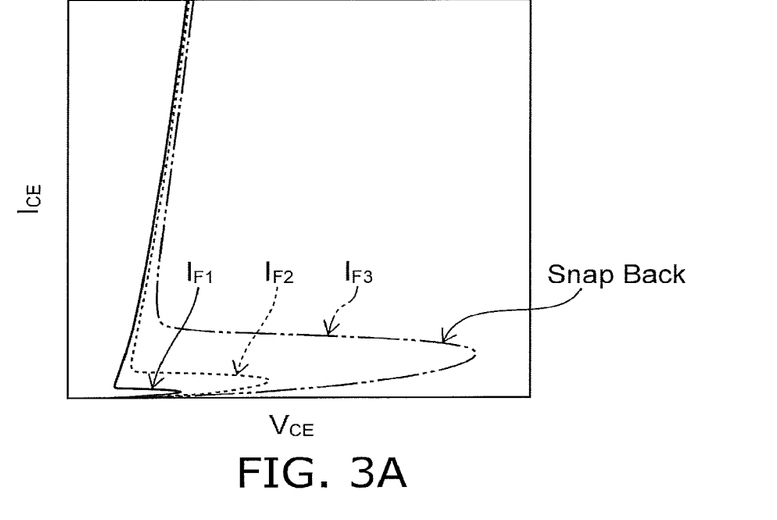
FIGS. 3A and 3B are schematic views showing the characteristics of the semiconductor device according to the embodiment.
Figure 3B:
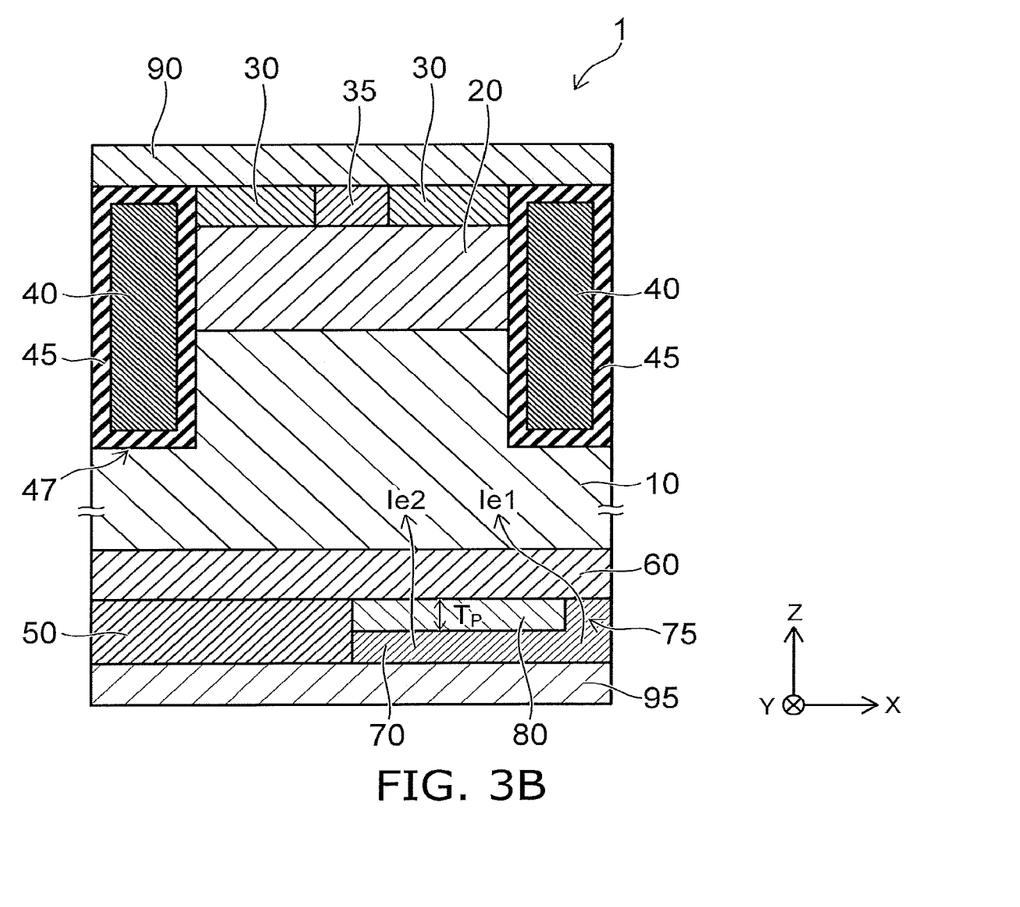

FIGS. 3A and 3B are a graph and a schematic view showing the characteristics of the semiconductor device 1 according to the embodiment. FIG. 3A is a graph showing the relationship between a collector/emitter voltage $V_{CE}$ and a forward current $I_{CE}$ in the diode operation. FIG. 3B is a schematic view showing electron currents Ie1 and Ie2 which are injected from the N-type cathode layer 70 into the N-base layer 10 through the N-type buffer layer 60.

The semiconductor device 1 operates as a diode, for example, when a positive potential is applied to the emitter electrode 90 and a negative potential is applied to the collector electrode 95. At this time, a PN junction between the N-type base layer 10 and the P-type base layer 20 is biased in a forward direction, and the forward current $I_{CE}$ flows between the emitter electrode 90 and the collector electrode 95.

The current characteristics $I_{F1}$, $I_{F2}$ and $I_{F3}$ are shown in FIG. 3A, which represent the forward currents $I_{CE}$ corresponding to the variations of the thickness $T_P$ in the Z-direction of the P-type barrier layer 80. When the thickness $T_P$ of the P-type barrier layer 80 is thicker, the forward current $I_{CE}$ changes from the current characteristic $I_{F1}$ to $I_{F3}$. That is, the snap back of the current value becomes larger.

For example, in the case where the forward current $I_{CE}$ is at low level, the electron current Ie1 flowing through the N-type connection portion 75 is injected from the N-type cathode layer 70 into the N-type base layer 10. As the collector/emitter voltage $V_{CE}$ increases, a potential barrier between the N-type cathode layer 70 and the P-type barrier layer 80 becomes lower, and the electron current Ie2 starts to flow. At this time, the collector/emitter voltage $V_{CE}$ starts to decrease and the current value exhibits the snap back. Accordingly, the degree of snap back (i.e., the peak value of $V_{CE}$) depends on the thickness $T_P$ of the P-type barrier layer 80.

For example, when the diode turns on, the electrical conduction loss becomes larger as the snap back becomes larger. Thus, it is preferable to suppress the snap back by setting the thickness $T_P$ of the P-type barrier layer 80 appropriately. Thereby, it is possible to reduce the electrical conduction loss. The thickness $T_P$ of the P-type barrier layer 80 is, for example, 0.5 μm or less, preferably 0.2 μm or less.

Next, a manufacturing method of the semiconductor device 1 will be described with reference to FIGS. 4A to 4D. FIGS. 4A to 4D are schematic cross sectional views sequentially showing the manufacturing processes of the semiconductor device 1 according to the embodiment.

Figure 4A:
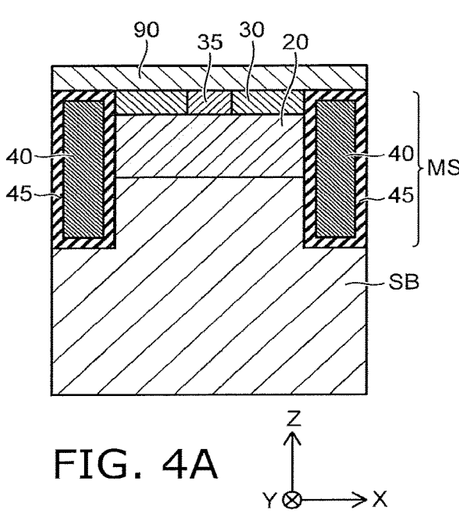
FIGS. 4A to 4D are schematic cross sectional views showing manufacturing processes of the semiconductor device according to the embodiment.

As shown in FIG. 4A, a semiconductor wafer SB is processed to be a prescribed thickness by grinding or polishing a back surface side thereof after the MOS structure MS and the emitter electrode 90 are formed on a front surface side of the semiconductor wafer SB.

The semiconductor wafer SB is, for example, an N-type silicon wafer having resistivity of 30 to 100 Ωcm. The semiconductor wafer SB contains N-type impurities with the same concentration as a concentration of N-type impurities in the N-type base layer 10. The P-type base layer 20, the N-type emitter layer 30, and the P-type contact layer 35 are formed, for example, by ion-implanting P-type impurities and N-type impurities respectively into the semiconductor wafer SB.

The gate electrode 40 is, for example, conductive polysilicon, and the gate insulating film 45 is, for example, a silicon oxide film or a silicon nitride film. The emitter electrode 90 is, for example, a metal layer including aluminum.

Figure 4B:
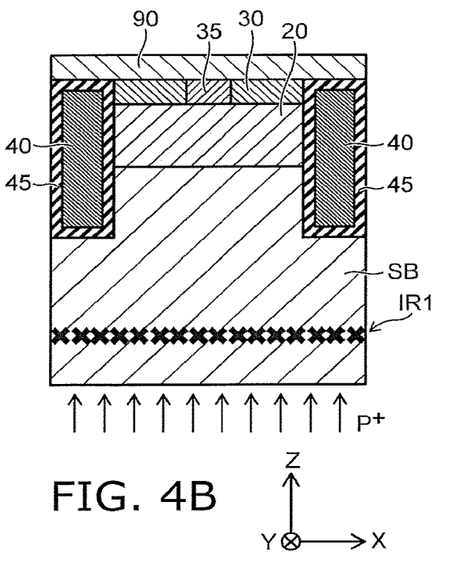

As shown in FIG. 4B, an injection layer IR1 is formed by ion-implanting the N-type impurity, for example, phosphorus (P) into the back surface side of the semiconductor wafer SB. The N-type impurity is injected, for example, under the condition of injection energy of 200 to 2000 keV, and a dose amount of $1 \times 10^{12}$ to $1 \times 10^{14}$ cm$^{-2}$.

Figure 4C:
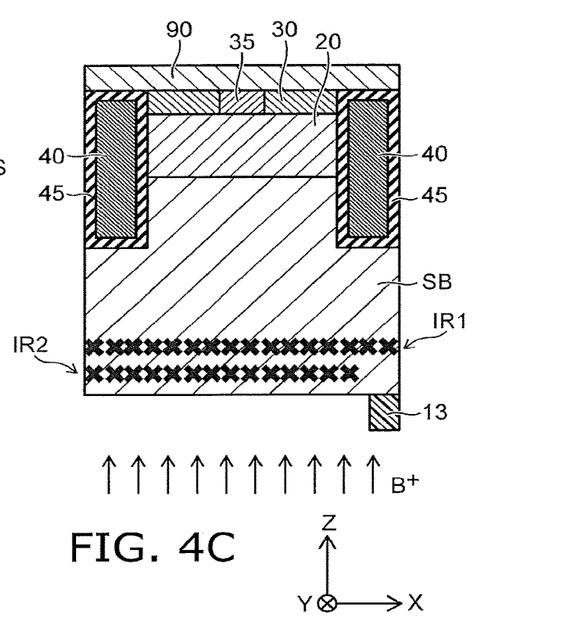

Then, an injection layer IR2 is formed as shown in FIG. 4C by selectively ion-implanting the P-type impurity, for example, boron (B) into the back surface side of the semiconductor wafer SB. An injection mask 13 is provided on the back surface of the semiconductor wafer SB. The injection mask 13 is disposed over a region where the N-type connection portion 75 is formed. The injection layer IR2 is positioned at a level shallower than a level of the injection layer IR1. The P-type impurity is injected, for example, under the condition of injection energy of 10 to 200 keV, and a dose amount of $1 \times 10^{13}$ to $1 \times 10^{15}$ cm$^{-2}$.

Figure 4D:
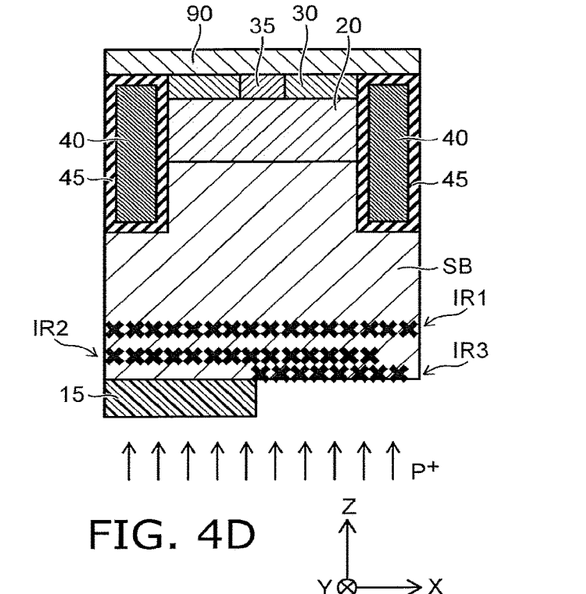

As shown in FIG. 4D, an injection layer IR3 is formed by selectively ion-implanting the N-type impurity, for example, phosphorous (P) into the back surface side of the semiconductor wafer SB. An injection mask 15 is provided on the back surface of the semiconductor wafer SB. The injection mask 15 is disposed over a region where the P-type collector layer 50 is formed. The injection layer IR3 is positioned at a level shallower than the level of the injection layer IR2. The N-type impurity is injected, for example, under the condition of injection energy of 10 to 100 keV, and a dose amount of $1 \times 10^{15}$ to $1 \times 10^{16}$ cm$^{-2}$.

Subsequently, the N-type impurities and P-type impurities injected are activated by a heat treatment. The heat treatment is performed, for example, using a laser annealing method. Thereby, the N-type buffer layer 60 is formed in a portion where the injection layer IR1 is positioned. The N-type cathode layer 70 is formed in a portion where the injection layer IR3 is positioned. The P-type barrier layer 80 is formed in a portion where the injection layer IR2 and injection layer IR3 are overlapped in the Z-direction. In the p-type barrier layer 80, the P-type impurities are compensated by the N-type impurities. The P-type barrier layer has P-type conductivity with an effective concentration of p-type impurities that is obtained by subtracting a concentration of N-type impurities from a concentration of P-type impurities.

The P-type collector layer 50 and the N-type connection portion 75 are formed in a portion where the injection layer IR2 and injection layer IR3 are not overlapped. The P-type collector layer 50 is formed in a portion where the injection layer IR3 is not provided, and the N-type connection portion 75 is formed in a portion where the injection layer IR2 is not provided. The P-type collector layer 50 has an effective concentration of P-type impurities higher than the effective concentration of P-type impurities in the P-type barrier layer 50.

Figure 5A:
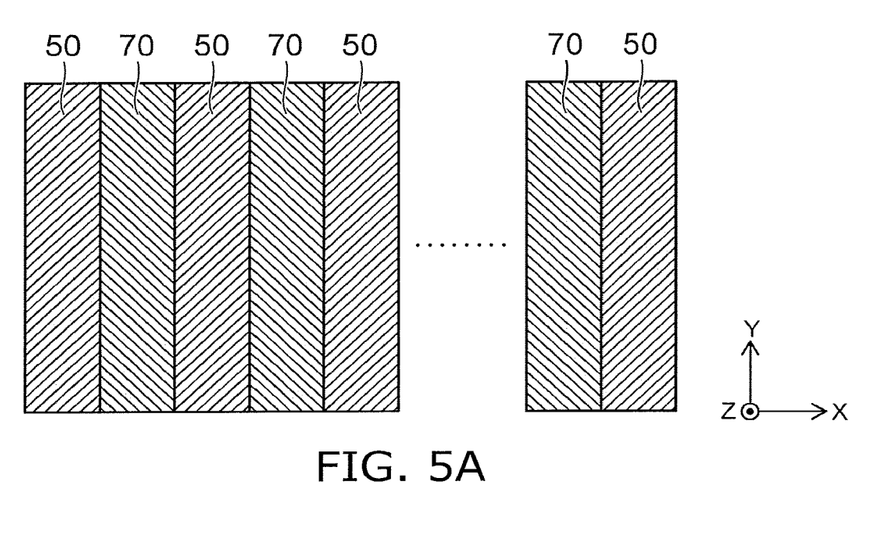
FIGS. 5A and 5B are schematic views showing a semiconductor device according to a first variation of the embodiment.
Figure 5B:
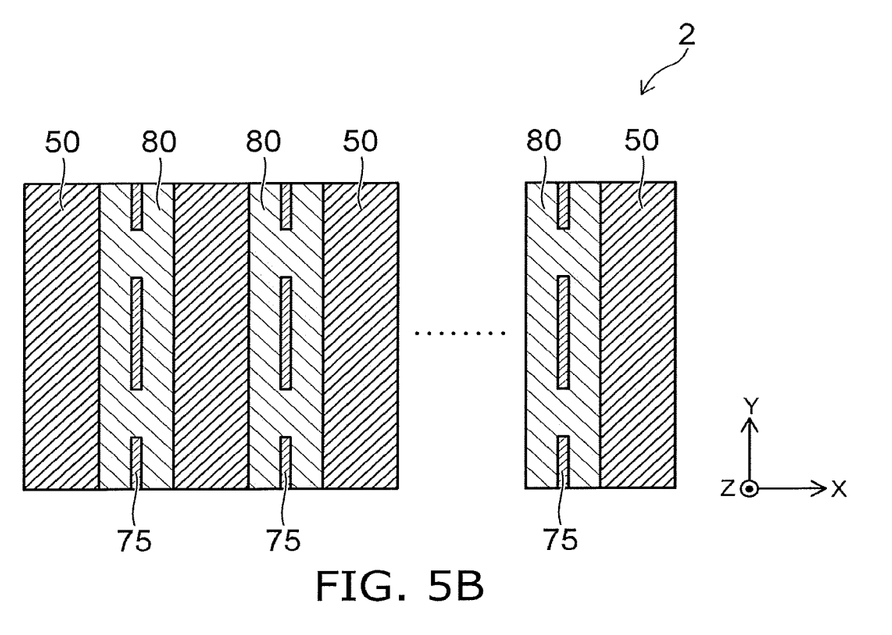

FIGS. 5A and 5B are schematic views showing a semiconductor device 2 according to a first variation of the embodiment. FIG. 5A is a schematic view showing a cross section corresponding to the cross section along A-A line shown in FIG. 2A. FIG. 5B is a schematic view showing a cross section corresponding to the cross section along B-B line shown in FIG. 2A.

As shown in FIG. 5A, the P-type collector layer 50 and the N-type cathode layer 70 extend, for example, in the Y-direction, and are disposed alternately in the X-direction.

As shown in FIG. 5B, the P-type barrier layer 80 extends in the Y-direction, and is disposed between the P-type collector layers 50. The N-type connection portion 75 is provided in the P-type barrier layer 80, and is disposed at a position away from the P-type collector layer 50. In this example, the multiple N-type connection portions 75 are arranged in the Y-direction. The multiple N-type connection portions 75 are positioned away from one another in the Y-direction.

A planar arrangement of the P-type collector layer 50, the P-type barrier layer 80 and the N-type connection portion 75 is not limited to the examples shown in FIG. 2C and FIG. 5B. For example, an arrangement is allowed in which respective area ratios thereof are maintained and the N-type connection portion 75 is positioned away from the p-type connector layer 50.

Figure 6:
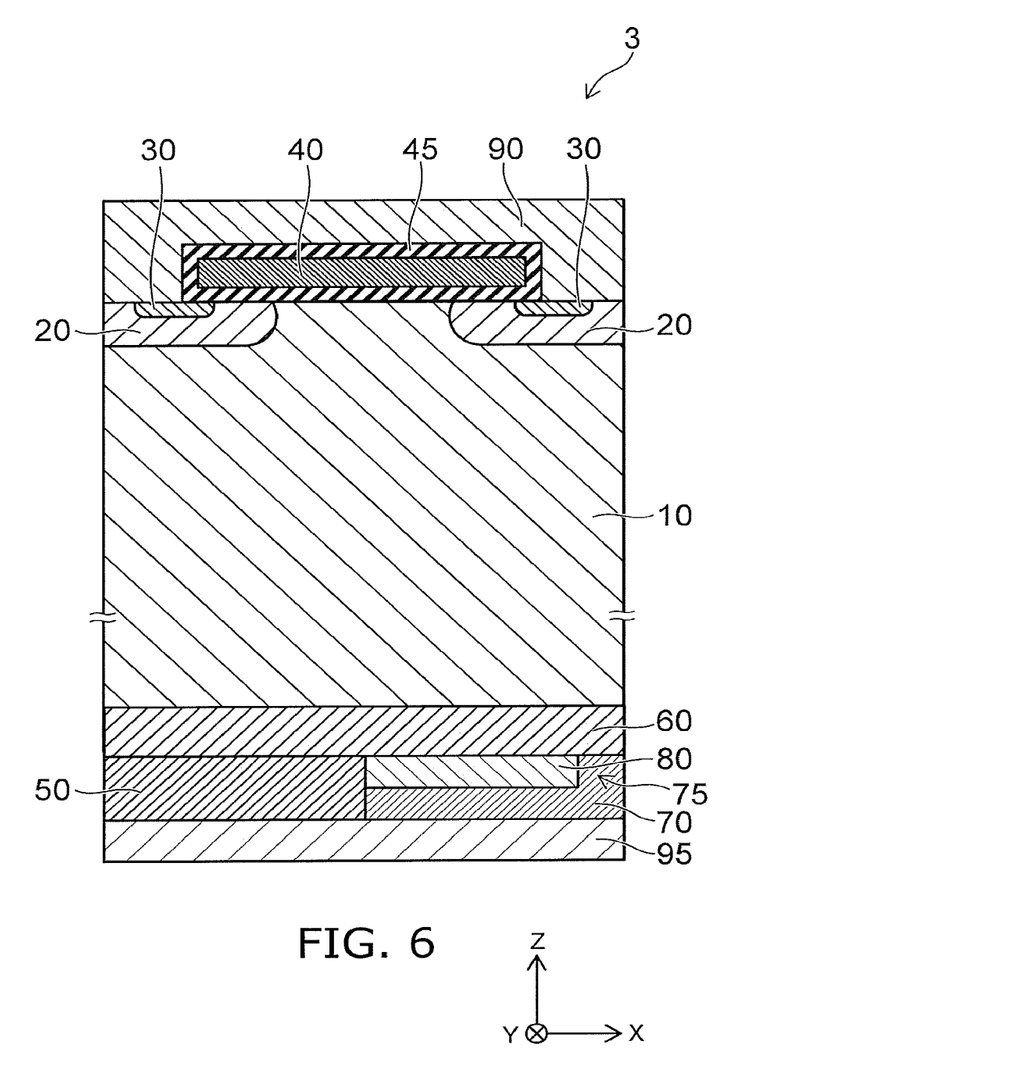
FIG. 6 is a schematic cross sectional view showing a semiconductor device according to a second variation of the embodiment.

FIG. 6 is a schematic cross sectional view showing a semiconductor device 3 according to a second variation of the embodiment. The semiconductor device 3 is a reverse conduction type IGBT having a planar type MOS structure.

As shown in FIG. 6, the P-type base layer 20 is selectively provided on the N-type base layer 10. The N-type emitter layer 30 is selectively provided on the P-type base layer 20. The gate electrode 40 is formed so as to face a portion of the N-type base layer 10 positioned between P-type base layers 20, and a portion of the P-type base layer 20 and a portion of the N-type emitter layer 30 via the gate insulating film 45.

The P-type collector layer 50, the N-type buffer layer 60, the N-type cathode layer 70 and the P-type barrier layer 80 are provided on the back surface side of the N-type base layer 10. The N-type cathode layer 70 is arranged with the P-type collector layer 50 in a direction along the back surface side of the N-type base layer 10.

The N-type buffer layer 60 is provided between the N-type base layer 10 and the P-type collector layer 50, and between the N-type base layer 10 and the N-type cathode layer 70. The P-type barrier layer 80 is disposed between the N-type buffer layer 60 and the N-type cathode layer 70. The P-type barrier layer 80 is provided to be connected to the P-type collector layer 50.

Furthermore, the semiconductor device 3 includes an N-type connection portion 75. The N-type connection portion 75 is positioned at a portion where the P-type barrier layer 80 does not interpose between the N-type buffer layer 60 and the N-type cathode layer 70. Thereby, the semiconductor device 3 can operates such that an IGBT are joined together with a diode.

Figure 7:
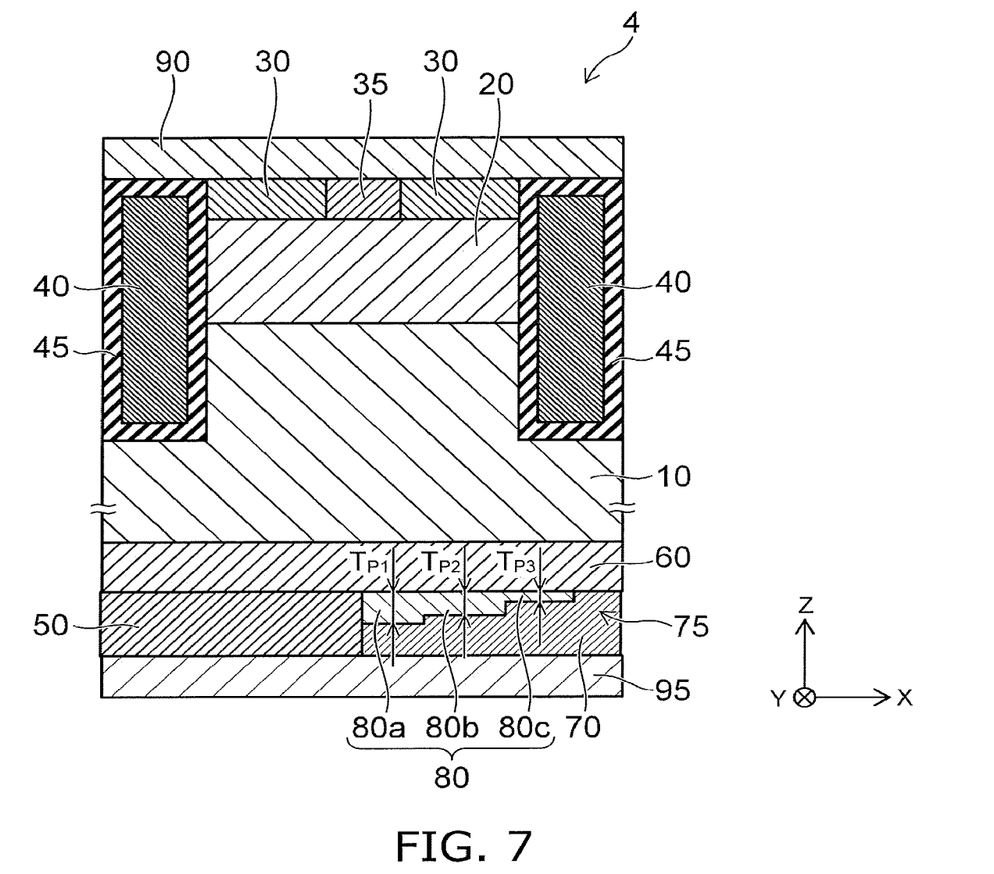
FIG. 7 is a schematic cross sectional view showing a semiconductor device according to a third variation of the embodiment.

FIG. 7 is a schematic cross sectional view showing a semiconductor device 4 according to a third variation of the embodiment. The semiconductor device 4 is a reverse conduction type IGBT having a trench gate type MOS structure. The MOS structure is not limited to this example, and may be a planar type.

As shown in FIG. 7, the P-type collector layer 50, the N-type buffer layer 60, the N-type cathode layer 70, and the P-type barrier layer 80 are provided on the back surface side of the N-type base layer 10. The N-type cathode layer 70 is arranged with the P-type collector layer 50 in a direction along the back surface side of the N-type base layer 10.

The N-type buffer layer 60 is provided between the N-type base layer 10 and the P-type collector layer 50, and between the N-type base layer 10 and the N-type cathode layer 70. The P-type barrier layer 80 is disposed between the N-type buffer layer 60 and the N-type cathode layer 70. The P-type barrier layer 80 is provided so as to be connected to the P-type collector layer 50.

Furthermore, the semiconductor device 4 includes an N-type connection portion 75. The N-type connection portion 75 is positioned at a portion where the P-type barrier layer 80 does not interpose between the N-type buffer layer 60 and the N-type cathode layer 70.

The P-type barrier layer 80 of this example includes a first region 80*a*, a second region 80*b* and a third region 80*c*. The first region 80*a*, the second region 80*b* and the third region 80*c* are disposed in order between the P-type collector layer 50 and the N-type connection portion 75. The first region 80*a* is connected to the P-type collector layer 50, and the third region 80*c* is adjacent to the N-type connection portion 75.

A thickness $T_{P1}$ in the Z-direction of the first region 80*a* is provided to be thicker than a thickness $T_{P2}$ in the Z-direction of the second region 80*b*. The thickness $T_{P2}$ of the second region 80*b* is provided to be thicker than a thickness $T_{P3}$ in the Z-direction of the third region 80*c*. Thereby, it is possible to improve the controllability of the snapback when operating as the diode.

The semiconductor device 4 may be configured such that the thicknesses in the Z-direction of the first region 80*a*, the second region 80*b* and the third region 80*c* are the same, for example, whereas the effective concentration of P-type impurity in the first region 80*a* is higher than the effective concentration of P-type impurity in the second region 80*b*, and the effective concentration of P-type impurity in the second region 80*b* is higher than the P-type impurity concentration in the third region 80*c*.

The semiconductor device 4 may be configured such that the thicknesses in the Z-direction of the first region 80*a*, the second region 80*b* and the third region 80*c* varies as shown in FIG. 7, for example, whereas the effective concentration of P-type impurity in the first region 80*a* is higher than the effective concentration of P-type impurity in the second region 80*b*, and the effective concentration of P-type impurity in the second region 80*b* is higher than the effective concentration of P-type impurity in the third region 80*c*.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
a first semiconductor layer of a first conductivity type;
a second semiconductor layer of a second conductivity type selectively provided on the first semiconductor layer;
a third semiconductor layer of the first conductivity type selectively provided on the second semiconductor layer;
a first insulating film covering a portion of the second semiconductor layer positioned between the first semiconductor layer and the third semiconductor layer;
a control electrode facing the portion of the second semiconductor layer via the first insulating film;
a fourth semiconductor layer of the second conductivity type provided on a lower surface side of the first semiconductor layer;
a fifth semiconductor layer of the first conductivity type, the fourth semiconductor layer and the fifth semiconductor layer being arranged in a first direction along a lower surface of the first semiconductor layer; and
a sixth semiconductor layer of the second conductivity type provided between the first semiconductor layer and the fifth semiconductor layer, the sixth semiconductor layer being connected to the fourth semiconductor layer, the sixth semiconductor layer having a compensated concentration of second conductivity type impurities obtained by subtracting a concentration of first conductivity type impurities from a concentration of second conductivity type impurities, the compensated concentration of second conductivity type impurities in the sixth semiconductor layer being lower than a compensated concentration of second conductivity type impurities in the fourth semiconductor layer, and
the device including a connecting portion of the first conductivity type positioned between the first semiconductor layer and the fifth semiconductor layer, the connecting portion electrically connecting the fifth semiconductor layer and the first semiconductor layer, the connecting portion being directly connected to the fifth semiconductor layer, the sixth semiconductor layer and the connecting portion being arranged in the first direction between the first semiconductor layer and the fifth semiconductor layer.

2. The semiconductor device according to claim 1, further comprising:
a first electrode electrically connected to the third semiconductor layer, the first electrode covering the control electrode;
a second insulating film electrically insulating the control electrode from the first electrode; and
a second electrode electrically connected to the fourth semiconductor layer and the fifth semiconductor layer.

3. The semiconductor device according to claim 2, wherein
the control electrode extends in a second direction directed toward the second electrode from the first electrode, the control electrode facing the first semiconductor layer, the second semiconductor layer and the third semiconductor layer via the first insulating film.

4. The semiconductor device according to claim 1, wherein
the fifth semiconductor layer is electrically connected to the first semiconductor layer via the connecting portion.

5. The semiconductor device according to claim 1, wherein
the fourth semiconductor layer and the fifth semiconductor layer are alternately disposed in the first direction along the lower surface of the first semiconductor layer.

6. The semiconductor device according to claim 1, wherein
the connecting portion is provided at a position away from the fourth semiconductor layer in the first direction along the lower surface of the first semiconductor layer.

7. The semiconductor device according to claim 5, wherein
the connecting portion is provided in a plurality, the plurality of connecting portions being arranged along the lower surface of the first semiconductor layer in a third direction crossing the first direction,
the fourth semiconductor layer extends along the lower surface of the first semiconductor layer in the third direction, and
the connecting portions are positioned between adjacent fourth semiconductor layers in the first direction.

8. The semiconductor device according to claim 1, further comprising:
a seventh semiconductor layer provided between the first semiconductor layer and the fourth semiconductor layer, and between the first semiconductor layer and the sixth semiconductor layer, the seventh semiconductor layer including first conductivity type impurities with a concentration higher than a concentration of first conductivity type impurities in the first semiconductor layer,
the fifth semiconductor layer being connected to the seventh semiconductor layer through the connecting portion.

9. The semiconductor device according to claim 8, wherein
the fifth semiconductor layer includes first conductivity type impurities with a concentration higher than a concentration of first conductivity type impurities in the seventh semiconductor layer.

10. The semiconductor device according to claim 1, wherein
the fourth semiconductor layer includes second conductivity type impurities with a concentration higher than a concentration of second conductivity type impurities in the second semiconductor layer.

11. The semiconductor device according to claim 2, further comprising:
an eighth semiconductor layer selectively provided between the second semiconductor layer and the first electrode, the eight semiconductor layer including second conductivity type impurities with a concentration higher than a concentration of second conductivity type impurities in the second semiconductor layer,
the eighth semiconductor layer contacting the second semiconductor layer, and being electrically connected to the first electrode.

12. The semiconductor device according to claim 1, wherein
the sixth semiconductor layer includes a first portion, a second portion and a third portion arranged in the first direction, the first portion being connected to the fourth semiconductor layer, the second portion being positioned between the first portion and the third portion, and
the first portion has a first thickness in a second direction directed towards the fifth semiconductor layer from the first semiconductor layer, the first thickness being larger than a second thickness in the second direction of the second portion, the second thickness being larger than a third thickness in the second direction of the third portion.

13. The semiconductor device according to claim 12, wherein
the first portion has a first compensated concentration of second conductivity type impurities higher than a second compensated concentration of second conductivity type impurities in the second portion, the second compensated concentration of second conductivity type impurities in the second portion being higher than a third compensated concentration of second conductivity type impurities in the third portion.

14. The semiconductor device according to claim 1, wherein
the sixth semiconductor layer includes a first portion, a second portion and a third portion arranged in the first direction, the first portion being connected to the fourth semiconductor layer, the second portion being positioned between the first portion and the third portion, and
the first portion has a first compensated concentration of second conductivity type impurities higher than a second compensated concentration of second conductivity type impurities in the second portion, the second compensated concentration in the second portion being higher than a third compensated concentration of second conductivity type impurities in the third portion.

15. The semiconductor device according to claim 14, wherein
the third portion of the sixth semiconductor layer is adjacent to the connecting portion.

* * * * *